United States Patent
Choi et al.

(10) Patent No.: US 9,685,630 B2
(45) Date of Patent: Jun. 20, 2017

(54) ORGANIC LIGHT EMITTING DIODE DISPLAY AND METHOD OF MANUFACTURING THE SAME

(71) Applicant: LG Display Co., Ltd., Seoul (KR)

(72) Inventors: Wonyeol Choi, Goyang-si (KR); ByoungChul Kim, Gunsan-si (KR); MyoungSoo Lee, Goyang-si (KR); Heesung Park, Busan (KR)

(73) Assignee: LG Display Co., Ltd., Seoul (KR)

( * ) Notice: Subject to any disclaimer, the term of this patent is extended or adjusted under 35 U.S.C. 154(b) by 36 days.

(21) Appl. No.: 14/811,191

(22) Filed: Jul. 28, 2015

(65) Prior Publication Data
US 2016/0036000 A1    Feb. 4, 2016

(30) Foreign Application Priority Data
Jul. 29, 2014 (KR) .................. 10-2014-0096556

(51) Int. Cl.
*H01L 51/52* (2006.01)
*H01L 51/56* (2006.01)
*H01L 51/00* (2006.01)

(52) U.S. Cl.
CPC .......... *H01L 51/5253* (2013.01); *H01L 51/56* (2013.01); *H01L 51/0097* (2013.01); *H01L 2251/301* (2013.01); *H01L 2251/5315* (2013.01); *H01L 2251/5338* (2013.01); *H01L 2251/558* (2013.01)

(58) Field of Classification Search
CPC ............. H01L 51/0545; H01L 51/0036; H01L 51/0541; H01L 51/5012
See application file for complete search history.

(56) References Cited

U.S. PATENT DOCUMENTS

| | | | | |
|---|---|---|---|---|
| 7,294,517 | B2 * | 11/2007 | Takayama | H01L 27/3258 438/149 |
| 7,456,922 | B2 * | 11/2008 | Eguchi | G02F 1/136227 349/138 |
| 8,481,998 | B2 * | 7/2013 | Cho | H01L 27/1248 257/100 |
| 2003/0127651 | A1 | 7/2003 | Murakami et al. | |
| 2003/0129790 | A1 | 7/2003 | Yamazaki et al. | |
| 2014/0138651 | A1 | 5/2014 | Oh | |

OTHER PUBLICATIONS

Extended European Search Report for European Patent Application No. EP 15178617, Dec. 7, 2015, 9 pages.

* cited by examiner

*Primary Examiner* — Quoc Hoang
(74) *Attorney, Agent, or Firm* — Fenwick & West LLP (57) ABSTRACT

An organic light-emitting diode (OLED) display includes: a substrate on which an organic light-emitting element is formed; an organic light-emitting element on a substrate; a first inorganic layer on the organic light-emitting element and made substantially of hydrogenated silicon nitride ($SiN_x$:H); an organic layer on a portion of the first inorganic layer; and a second inorganic layer on and completely covering the organic layer. Edges of the second inorganic layer come in contact with the first inorganic layer. A ratio of a number of oxygen atoms to silicon atoms contained in the first inorganic layer ranges from 0.12 to 0.19, and a ratio of a number of nitrogen atoms to silicon atoms contained in the first inorganic layer ranges from 0.9 to 1.5. The first inorganic layer and the second inorganic layer have substantially the same composition.

20 Claims, 5 Drawing Sheets

| | O/Si | N/Si | ETCHING RATE (nm/min) | Si—H/N—H |
|---|---|---|---|---|
| FIRST AND SECOND INORGANIC LAYERS ACCORDING TO EXEMPLARY EMBODIMENT OF THE PRESENT DISCLOSURE | 0.15 | 1.20 | 532 | 0.72 |
| FIRST AND SECOND INORGANIC LAYERS ACCORDING TO COMPARATIVE EXAMPLE | 0.10 | 0.80 | 957 | 0.57 |

ORGANIC LIGHT EMITTING DIODE DISPLAY AND METHOD OF MANUFACTURING THE SAME

CROSS-REFERENCE TO RELATED APPLICATIONS

This application claims the priority of Korean Patent Application No. 10-2014-0096556 filed on Jul. 29, 2014, in the Korean Intellectual Property Office, the disclosure of which is incorporated herein by reference.

BACKGROUND

Technical Field

The present disclosure relates to an organic light-emitting diode (OLED) display and a method of manufacturing the same. More particularly, the present disclosure relates to an OLED display capable of reducing bubbles (foams) in an interface between an upper inorganic layer and a lower inorganic layer, and a method of manufacturing the same.

Description of the Related Art

An organic light-emitting diode (OLED) display is capable of producing light on its own and thus does not require an additional light source, unlike liquid crystal displays (LCDs). Therefore, OLED displays can be made lighter and thinner than LCDs. Further, an OLED display has advantages in that it is driven with low voltage to consume less power, and is capable of reproducing vivid colors, has a fast response time, wide viewing angle and infinite contrast ratio (CR). For these reasons, an OLED display is currently under development as the next generation display device.

OLED displays employ a light-emitting layer made of an organic material and thus are very sensitive to moisture, oxygen and etc. Accordingly, in order to suppress oxygen and moisture permeation into the organic light-emitting layer, various techniques for sealing or encapsulating an organic light-emitting element are used.

For a top-emission OLED display in which light generated in an organic light-emitting layer is emitted toward the top direction, a sealing element is required to have a certain degree of transparency. Accordingly, glass is typically used as the sealing element since it is easily available and has high transparency. However, as flexible OLED displays prevail in recent years, there have been attempts to replace glass having low flexibility with an inorganic layer as the sealing element.

Although a thin, single inorganic layer has high transparency and flexibility, cracks or other defects may occur if the inorganic layer is repeatedly bent. Since moisture may permeate through cracks created in the inorganic layer, the single inorganic layer cannot effectively suppress moisture from permeating the organic light-emitting layer.

To overcome this shortcoming, a thin film encapsulation technique in which inorganic layers and organic layers are alternately stacked on one another to seal the organic light-emitting element has been proposed. According to the thin film encapsulation technique, an organic layer for compensation of cracks caused by bending, stress, foreign matter, etc. and for leveling step differences is formed on an inorganic layer, and then another inorganic layer is formed on the organic layer. Since an organic layer cannot effectively suppress moisture permeation, edges of an upper inorganic layer come in contact with a lower inorganic layer such that the upper inorganic layer completely covers the organic layer, thereby suppressing moisture from permeating the organic layer.

As a material for inorganic layers in the thin film encapsulation technique, silicon nitride (SiN) has been commonly used. However, in order to improve performance characteristics of top-emission OLED displays, inorganic layers having better barrier property and high transparency for use in the thin film encapsulation technique need to be developed.

SUMMARY

The inventors of the present disclosure have noticed that performance characteristics of OLED displays, especially top-emission OLED displays can be improved by forming inorganic layers for use in thin film encapsulation with hydrogenated silicon nitride ($SiN_x$:H), in which hydrogen is included in silicon nitride. The inventors of the present disclosure realized that hydrogenated silicon nitride has better barrier properties and higher transparency compared to other materials. Manufacturing an upper inorganic layer and a lower inorganic layer with hydrogenated silicon nitride ($SiN_x$:H), however, results in undesired bubbles (or other air pockets) being created at an interface (adhesive surface) between the upper inorganic layer and the lower inorganic layer. Such bubbles cause the adhesion between the upper inorganic layer and the lower inorganic layer to become weak, resulting in so-called blistering. As a result, moisture and oxygen may easily permeate into OLED displays.

The inventors of the present disclosure have studied techniques for reducing such bubbles created at the interface between the upper and lower inorganic layers made of hydrogenated silicon nitride ($SiN_x$:H). As a result, they have found out that bubbles created at the interface between the upper and lower inorganic layers can be reduced by appropriately adjusting various ratios of components contained in the upper and lower inorganic layers within particular ranges.

In view of the above, an object of the present disclosure is to provide an OLED display capable of reducing bubbles at an interface between an upper inorganic layer and a lower inorganic layer, and a method of manufacturing the same.

Another object of the present disclosure is to provide an OLED display having good adhesion strength between an upper inorganic layer and a lower inorganic layer, and a method of manufacturing the same.

Yet another object of the present disclosure is to provide an OLED display including a sealing element having high reliability and transparency, and a method of manufacturing the same.

It should be noted that objects of the present disclosure are not limited to the above-described objects, and other objects of the present disclosure will be apparent to those skilled in the art from the following descriptions.

According to an aspect of the present disclosure, there is provided an organic light-emitting diode (OLED) display, including: an organic light-emitting element on a substrate; a first inorganic layer on the organic light-emitting element and made substantially of hydrogenated silicon nitride ($SiN_x$:H); an organic layer on a portion of the first inorganic layer; and a second inorganic layer on and completely covering the organic layer. Edges of the second inorganic layer come in contact with the first inorganic layer. A ratio of a number of oxygen atoms to silicon atoms contained in the first inorganic layer ranges from 0.12 to 0.19, and a ratio of a number of nitrogen atoms to silicon atoms contained in the first inorganic layer ranges from 0.9 to 1.5. The first inorganic layer and the second inorganic layer have substantially the same composition. The OLED display can suppress bubbles from being created at the interface between the first inorganic layer and the second inorganic layer, reducing moisture and oxygen permeation into the organic light-emitting element.

The first inorganic layer and the second inorganic layer each may have a thickness between 5,000 Å (Å=0.1 nm) and 15,000 Å.

The first inorganic layer and the second inorganic layer each may have a transparency between 90% and 99.9%.

The first inorganic layer and the second inorganic layer each may have an etch rate ranging from 400 nm/min to 700 nm/min in a hydrofluoric solution in which hydrofluoric acid (HF) and water are mixed at the ratio of 1:6.

A ratio of silicon-hydrogen bonds to nitrogen-hydrogen bonds (Si—H/N—H) contained in each of the first inorganic layer and the second inorganic layer may range from 0.6 to 0.75.

An adhesion length between an edge of the second inorganic layer and an edge of the first inorganic layer may be at least 50 μm.

The organic layer may have a thickness between 5 μm and 30 μm.

The organic layer may be made of an acryl-based resin or an epoxy-based resin.

The substrate may be a flexible substrate.

The OLED display may be a top-emission OLED display.

According to another aspect of the present disclosure, there is provided a method of manufacturing an organic light-emitting diode (OLED) display, the method including: forming an organic light-emitting element on a substrate; forming a first inorganic layer made substantially of hydrogenated silicon nitride ($SiN_x$:H) on the organic light-emitting element; forming an organic layer on a part of the first inorganic layer; and forming a second inorganic layer on the organic layer such that it completely covers the organic layer. Edges of the second inorganic layer are in contact with the first inorganic layer. A ratio of a number of oxygen atoms to silicon atoms contained in the first inorganic layer ranges from 0.12 to 0.19, and a ratio of a number of nitrogen atoms to silicon atoms contained in the first inorganic layer ranges from 0.9 to 1.5. The first inorganic layer and the second inorganic layer have substantially the same composition. According to the method of manufacturing an OLED display, a sealing element having high reliability and transparency can be provided.

Each of the first inorganic layer and the second inorganic may be formed at a temperature between 70° C. and 110° C.

Each of the first inorganic layer and the second inorganic may be formed by plasma-enhanced chemical vapor deposition (PECVD).

Each of the first inorganic layer and the second inorganic may be formed at a pressure between $10^{-1}$ Torr and $10^{-5}$ Torr.

The forming the first organic layer and the forming of the second organic layer each may include: supplying a silane ($SiH_4$) gas and an ammonia ($NH_3$) gas onto the organic light-emitting element; and converting the silane ($SiH_4$) gas and the ammonia ($NH_3$) gas into plasma.

The supplying of the silane ($SiH_4$) gas and the ammonia ($NH_3$) gas may include supplying a nitrogen ($N_2$) gas.

Each of the ratio of oxygen to silicon contained in the first inorganic layer and the ratio of nitrogen to silicon contained in the first inorganic layer may be adjusted by adjusting a ratio of the ammonia ($NH_3$) gas to the silane ($SiH_4$) gas supplied onto the organic light-emitting element.

Oxygen ($O_2$) contained in each of the first inorganic layer and the second inorganic layer may be derived from ambient air.

Particulars of various exemplary embodiments of the present disclosure are included in the detailed description and the accompanying drawings.

According to the present disclosure, it is possible to reduce bubbles in an interface between an upper inorganic layer and a lower inorganic layer by limiting a ratio of the number of oxygen atoms to silicon atoms and a ratio of the number of nitrogen atoms to silicon atoms contained in the upper inorganic layer and the lower inorganic layer.

According to the present disclosure, it is possible to suppress moisture and oxygen from permeating through an interface between an upper inorganic layer and a lower inorganic layer, while allowing for high transparency and flexibility of the upper inorganic layer and the lower inorganic layer.

It should be noted that effects of the present disclosure are not limited to the above-described effects, and other effects of the present disclosure will be apparent to those skilled in the art from the following descriptions.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE PREFERRED EMBODIMENT

Advantages and features of the present disclosure and methods to achieve them will become apparent from the descriptions of exemplary embodiments herein below with reference to the accompanying drawings. However, the present disclosure is not limited to exemplary embodiments disclosed herein but may be implemented in various different ways. The exemplary embodiments are provided for making the disclosure of the present disclosure thorough and for fully conveying the scope of the present disclosure to those skilled in the art. It is to be noted that the scope of the present disclosure is defined only by the claims.

The shapes, sizes, ratios, angles, numbers, and the like illustrated in the accompanying drawings for describing the exemplary embodiments of the present disclosure are merely examples, and the present disclosure is not limited thereto. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly" is not used.

As used herein, a phrase "an element A on an element B" refers to that the element A may be disposed directly on the element B and/or the element A may be disposed indirectly on the element B via another element C.

The terms first, second, third and the like in the descriptions and in the claims are used for distinguishing between similar elements and not necessarily for describing a sequential or chronological order. These terms are used to merely distinguish one element from another. Accordingly, as used herein, a first element may be a second element within the technical idea of the present disclosure.

Like reference numerals denote like elements throughout the descriptions.

The drawings are not to scale and the relative dimensions of various elements in the drawings are depicted schematically and not necessarily to scale.

Features of various exemplary embodiments of the present disclosure may be combined partially or totally. As will be clearly appreciated by those skilled in the art, technically various interactions and operations are possible. Various exemplary embodiments can be practiced individually or in combination.

Hereinafter, exemplary embodiments of the present disclosure will be described in detail with reference to the accompanying drawings.

Figure 1:
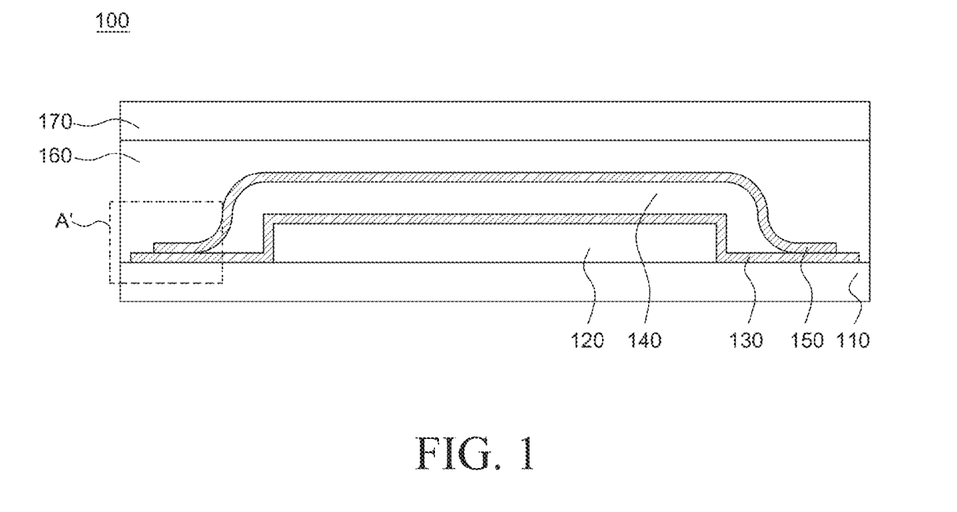
FIG. 1 is a schematic cross-sectional view of a top-emission OLED display according to an exemplary embodiment of the present disclosure.
Figure 2:
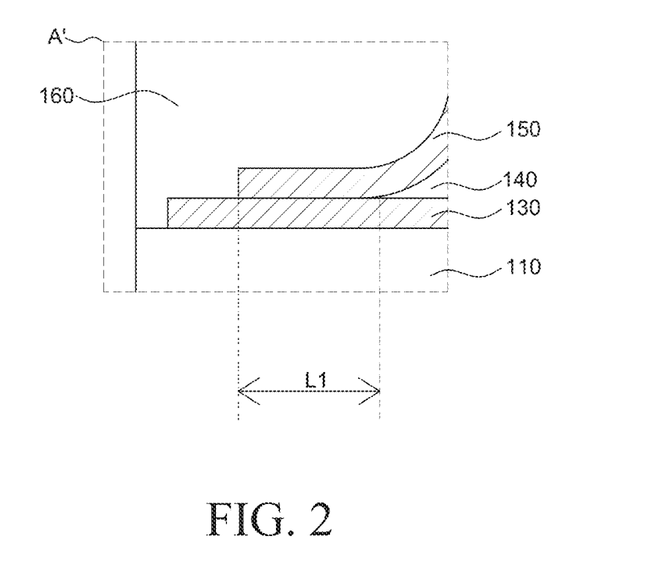
FIG. 2 is an enlarged cross-sectional view of portion A' of the OLED display shown in FIG. 1.

FIG. 1 is a schematic cross-sectional view of a top-emission OLED display according to an exemplary embodiment of the present disclosure. FIG. 2 is an enlarged cross-sectional view of portion A' of the OLED display shown in FIG. 1.

Referring to FIGS. 1 and 2, an OLED display 100 includes a substrate 110, an organic light-emitting element 120, a first inorganic layer 130, an organic layer 140, a second inorganic layer 150, an adhesive layer 160 and a barrier layer 170.

The substrate 110 is an element for supporting and protecting a variety of elements of the OLED display 100. The substrate 110 may be a flexible substrate which is bendable and may be made of a polyimide-based material, for example.

As shown in FIG. 1, the organic light-emitting element 120 is disposed on the substrate 110. The organic light-emitting element 120 may include elements such as an anode, an organic light-emitting layer, a cathode, etc.

As shown in FIG. 1, the first inorganic layer 130 is formed on the organic light-emitting element 120. The first inorganic layer 130 completely covers the organic light-emitting element 120. The first inorganic layer 130 has barrier properties so that it can protect the organic light-emitting element 120 from moisture or oxygen permeating into the OLED display 100.

The first inorganic layer 130 is made substantially of hydrogenated silicon nitride ($SiN_x$:H). The first inorganic layer 130 may contain impurities such as oxygen ($O_2$) in addition to hydrogenated silicon nitride ($SiN_x$:H). In terms of numerical values, an element can be regarded as being made substantially of hydrogenated silicon nitride ($SiN_x$:H) if the portion of the hydrogenated silicon nitride ($SiN_x$:H) of the element is 90 wt. % or more.

The ratio of oxygen to silicon contained in the first inorganic layer 130 may be limited to 0.12 to 0.19, more specifically 0.14 to 0.16. If the ratio of oxygen to silicon contained in the first inorganic layer 130 is less than 0.12, the first inorganic layer 130 becomes yellowish, which results in degraded optical transparency. If the ratio of oxygen to silicon contained in the first inorganic layer 130 is greater than 0.19, bubbles (or other types of air pockets) are created at the interface between the first inorganic layer 130 and the second inorganic layer 150.

The ratio of nitrogen to silicon contained in the first inorganic layer 130 may be limited to 0.9 to 1.5, more specifically from 1.1 to 1.3. If the ratio of nitrogen to silicon contained in the first inorganic layer 130 is less than 0.9, the first inorganic layer 130 becomes yellowish, which results in degraded optical transparency. If the ratio of nitrogen to silicon contained in the first inorganic layer 130 is greater than 1.5, the first inorganic layer 130 becomes porous, which causes moisture and oxygen to possibly permeate into the organic light-emitting element 120 through the holes at the first inorganic layer 130 more easily.

Herein, the ratio of oxygen to silicon and the ratio of nitrogen to silicon are defined by numbers of the atoms, rather than by weight or volume. The numbers of the atoms of silicon, oxygen and nitrogen contained in the first inorganic layer 130 may be measured by using X-ray photoelectron spectroscopy (XPS), for example.

In addition, the ratio of oxygen to silicon and the ratio of nitrogen to silicon are analyzed from the bulk of the first inorganic layer 130, not from the surface of the first inorganic layer 130 exposed to ambient air. This is because the number of oxygen and nitrogen atoms in the data analyzed from the surface of the first inorganic layer 130 exposed to ambient air is less reliable. Assuming that the first inorganic layer 130 has the thickness of 10,000 Å, the surface of the first inorganic layer 130 may be defined as a part having a thickness of 300 Å from the surface exposed to ambient air, and the bulk of the first inorganic layer 130 may be defined as the remaining portions thereof.

That is, the first inorganic layer 130 is made substantially of hydrogenated silicon nitride ($SiN_x$:H) and has a ratio of oxygen to silicon between 0.12 and 0.19 and a ratio of nitrogen to silicon between 0.9 and 1.5. Accordingly, the first inorganic layer 130 may have a high transparency, e.g., from 90% to 99.9% with respect to the visible wavelength range. As used herein, transparency of an element is defined as a ratio of the amount of light passing through the element to the amount of light incident on the element. High transparency of the first inorganic layer 130 allows the light generated in the organic light-emitting element 130 to be emitted outside the OLED display 100.

The first inorganic layer 130 is not porous but is densely composed, so that it may have a low etch rate. Specifically, the first inorganic layer 130 may have an etch rate ranging from 400 nm/min to 700 nm/min, more specifically 500 nm/min to 600 nm/min in a hydrofluoric solution in which hydrofluoric acid (HF) and water are mixed at the ratio of 1:6. A lower etch rate of the first inorganic layer 130 may mean that the first inorganic layer 130 has higher reliability, i.e., it is possible to effectively suppress moisture and oxygen from permeating the organic light-emitting layer 120 through the first inorganic layer 130.

A ratio of silicon-hydrogen bonds to nitrogen-hydrogen bonds contained in the first inorganic layer 130 (Si—H/N—H) may range from 0.6 to 0.75, more specifically 0.69 to 0.74. Since the first inorganic layer 130 has a relatively high rate of silicon-hydrogen bonds to nitrogen-hydrogen bonds (Si—H/N—H), the possibility that bubbles are created at the interface between the first inorganic layer 130 and the second inorganic layer 150 can be lowered. The rate of silicon-hydrogen bonds to nitrogen-hydrogen bonds (Si—H/N—H) is also defined by the number of the bonds.

The first inorganic layer 130 may have a thickness between 5,000 Å and 15,000 Å, more specifically 10,000 Å.

The first inorganic layer 130 may be formed at a temperature between 70° C. to 110° C., more specifically 80° C. to 100° C. If the first inorganic layer 130 is formed at a high temperature, the organic light-emitting layer composed of an organic material may be damaged due to the high temperature.

The first inorganic layer 130 may be formed by plasma-enhanced chemical vapor deposition (PECVD). Since the plasma-enhanced chemical vapor deposition (PECVD) can be performed at a low temperature, it is possible to avoid the organic light-emitting layer from being exposed to a high temperature.

The first inorganic layer 130 may be formed in a vacuum environment at a low pressure, e.g., between $10^{-1}$ Torr and $10^{-5}$ Torr, more specifically between $10^{-2}$ Torr and $10^{-4}$ Torr.

As shown in FIGS. 1 and 2, the organic layer 140 is formed on a part of the first inorganic layer 130. Specifically, the organic layer 140 is positioned at the center portion of the first inorganic layer 130 as a single layer, and not positioned at edges of the first inorganic layer 130. The organic layer 140 may level unevenness or steps of the first inorganic layer 130 and may compensate for cracks caused by foreign matter, etc.

The organic layer 140 may be made of an acryl-based resin or an epoxy-based resin. But the present disclosure is not limited to the materials of the organic layer 140. In order to effectively compensate for cracks created by foreign matter, etc., the organic layer 140 may have a viscosity between 500 centipoises (cps) and 30,000 cps, more specifically between 2,000 cps and 4,000 cps.

The organic layer 140 may further include a wetting agent (or other material that serves the same purpose) for reducing a surface tension of the organic layer 140 for improving uniformity, a leveling agent for improving the surface evenness of the organic layer 140, and a defoaming agent for removing foam in the organic layer 140, as the additive agents.

The organic layer 140 may have a thickness from 5 μm to 30 μm, more specifically 20 μm.

In order to avoid the organic light-emitting layer made of an organic material from being damaged due to a high temperature, the organic layer 140 may be formed at the temperature of 110° C. or below.

As shown in FIGS. 1 and 2, the second inorganic layer 150 is formed on the organic layer 140 so that it completely covers the organic layer 140. Similarly to the first inorganic layer 130, the second inorganic layer 150 has barrier properties so that it can protect the organic light-emitting element 120 from moisture or oxygen permeating into the OLED display 100.

The second inorganic layer 150 may have substantially the same composition as the first inorganic layer 130. As used herein, the phrase that the second inorganic layer 150 has substantially the same composition as the first inorganic layer 130 means not only that the second inorganic layer 150 and the first inorganic layer 130 have the completely same composition but also that the second inorganic layer 150 and the first inorganic layer 130 have the same composition within a process error margin. For example, the second inorganic layer 150 can be regarded as having substantially the same composition as the first inorganic layer 130 if the second inorganic layer 150 has a composition with a deviation of ±10% from a composition of the first inorganic layer 130.

Since the second inorganic layer 150 has substantially the same composition as the first inorganic layer 130, the second inorganic layer 150 and the first inorganic layer 130 have substantially the same chemical and physical characteristics. Specifically, the second inorganic layer 150 may be made substantially of hydrogenated silicon nitride ($SiN_x$:H) and may have an etch rate ranging from 400 nm/min to 700 nm/min in a hydrofluoric solution in which hydrofluoric acid (HF) and water are mixed at the ratio of 1:6. In addition, the ratio of oxygen to silicon contained in the second inorganic layer 150 is limited to 0.12 to 0.19. The ratio of nitrogen to silicon contained in the second inorganic layer 150 is limited to 0.9 to 1.5. The ratio of silicon-hydrogen bonds to nitrogen-hydrogen bonds contained in the second inorganic layer 150 (Si—H/N—H) may range from 0.6 to 0.75.

Similar to the first inorganic layer 130, the second inorganic layer 150 may have a thickness between 5,000 Å and 15,000 Å, may be formed at a temperature between 70° C. to 110° C., may be formed by plasma-enhanced chemical vapor deposition (PECVD), and may be formed in a vacuum environment at a low pressure, e.g., between $10^{-1}$ Torr and $10^{-5}$ Torr.

As shown in FIGS. 1 and 2, the edges of the second inorganic layer 150 are in contact with the first inorganic layer 130. Specifically, as the second inorganic layer 150 is formed on the organic layer 140 so that it completely covers the organic layer 140, the edges of the second inorganic layer 150 that do not cover the organic layer 140 are in contact with the first inorganic layer 130. The edges of the second inorganic layer 150 are in contact with and are attached to the first inorganic layer 130 with adhesion strength.

Improper adhesion strength between the first inorganic layer 130 and the second inorganic layer 150 may seriously affect the performance of suppressing moisture and oxygen permeation by the first inorganic layer 130 and the second inorganic layer 150. If the adhesion strength between the first inorganic layer 130 and the second inorganic layer 150 becomes weak, so-called blistering may occur between the first inorganic layer 130 and the second inorganic layer 150, resulting in moisture and oxygen being easily permeated between the first inorganic layer 130 and the second inorganic layer 150.

If the first inorganic layer 130 and the second inorganic layer 150 are made substantially of hydrogenated silicon nitride ($SiN_x$:H) and the edges of the second inorganic layer 150 are in contact with the first inorganic layer 130, bubbles (or other types of air pockets) may be easily created at the interface between the first inorganic layer 130 and the second inorganic layer 150. Bubbles created at the interface between the first inorganic layer 130 and the second inorganic layer 150 make the adhesive strength weak. Accordingly, it is necessary to suppress such bubbles.

According to the present disclosure, it is possible to suppress bubbles at the interface between the first inorganic layer 130 and the second inorganic layer 150 while achieving good transparency of the first inorganic layer 130 and the second inorganic layer 150, by way of appropriately adjusting the ratio of oxygen to silicon contained in each of the first inorganic layer 130 and the second inorganic layer 150 to 0.12 to 0.19, and appropriately adjusting the ratio of nitrogen to silicon contained in each of the first inorganic layer 130 and the second inorganic layer 150 to 0.9 to 1.5 Accordingly, it is possible to effectively suppress moisture and oxygen from permeating through the first inorganic layer 130 and the second inorganic layer 150, so that defects of the OLED display 100 can be reduced. In addition, transparent, flexible OLED displays can be implemented easily.

The adhesion length L1 (i.e. a region where adhesion occurs) of the first inorganic layer 130 and the second inorganic layer 150 may be at least 50 μm. The organic layer 140 can be more securely sealed by the first inorganic layer 130 and the second inorganic layer 150 when the adhesion length L1 is 50 μm or greater, such that moisture cannot directly permeate the organic layer 140.

As shown in FIGS. 1 and 2, the adhesive layer 160 is formed on the second inorganic layer 150. The adhesive layer 160 serves to attach the barrier layer 170 to the second inorganic layer 150. The adhesive layer 160 may be made of a transparent, flexible material, e.g., an insulative material selected from an olefin-based material, an acryl-based material and a silicon-based material.

As shown in FIG. 1, the barrier layer 170 is formed on the adhesive layer 160. The barrier layer 170 suppresses moisture and oxygen from permeating the organic light-emitting element 120. The barrier layer 170 may be made of copolyester thermoplastic elastomer (COP), cycoolefin copolymer (COC), polycarbonate (PC), etc., such that it can be attached to the second inorganic layer 150 via the adhesive layer 160 by a simple pressing process, without performing a vacuum process such as a chemical vapor deposition (CVD) process and an atomic layer deposition (ALD) process. It is advantageous for flexible OLED displays to employ the barrier layer 170 in that good barrier properties can be achieved with a smaller number of inorganic layers for use in the thin film encapsulation.

Thin-film transistors for controlling voltages (or current) to the organic light-emitting element 120 may be further formed on the substrate 110.

Figure 3:
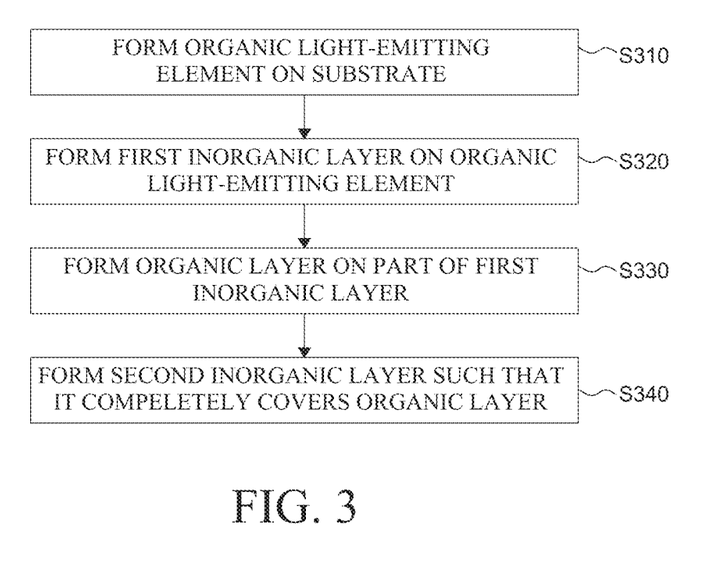
FIG. 3 is a flowchart for illustrating a method of manufacturing an OLED display according to an exemplary embodiment of the present disclosure.

FIG. 3 is a flowchart for illustrating a method of manufacturing an OLED display according to an exemplary embodiment of the present disclosure.

Referring to FIG. 3, an organic light-emitting element is formed on a substrate (S310).

Prior to forming the organic light-emitting element, thin-film transistors may be formed on the substrate.

Subsequently, referring to FIG. 3, a first inorganic layer made substantially of hydrogenated silicon nitride ($SiN_x$:H) is formed on the organic light-emitting element (S320).

The ratio of oxygen to silicon contained in the first inorganic layer 130 is limited to 0.12 to 0.19. The ratio of nitrogen to silicon contained in the first inorganic layer 130 is limited to 0.9 to 1.5.

The first inorganic layer may be formed by plasma-enhanced chemical vapor deposition (PECVD) at a low temperature. Specifically, the first inorganic layer may be formed by supplying a silane ($SiH_4$) gas and an ammonia ($NH_3$) gas onto the organic light-emitting element in a chamber, and applying power to convert the silane ($SiH_4$) gas and the ammonia ($NH_3$) gas into plasma. In doing so, a nitrogen ($N_2$) gas may be used as a carrier gas for transferring the silane ($SiH_4$) gas and the ammonia ($NH_3$) gas into the chamber. In addition, the first inorganic layer may be formed at a temperature between 70° C. and 130° C. The power supplied may range from 2,000 W to 2,500 W. The pressure may range from 0.5 Torr to 1 Torr.

If the first inorganic layer is formed using a silane ($SiH_4$) gas and an ammonia ($NH_3$) gas, by adjusting the ratio of the ammonia ($NH_3$) gas to the silane ($SiH_4$) gas under a specified pressure, e.g., the pressure of $10^{-3}$ Torr, the ratio of oxygen to silicon contained in the first inorganic layer may be limited to 0.12 to 0.19, and the ratio of nitrogen to silicon contained in the first inorganic layer may be limited to 0.9 to 1.5. At this time, in the first inorganic layer made substantially of hydrogenated silicon nitride ($SiN_x$:H), silicon (Si) may be derived from silane ($SiH_4$), nitrogen (N) may be derived from ammonia ($NH_3$), and oxygen ($O_2$) may be derived from ambient air.

Subsequently, referring to FIG. 3, an organic layer is formed on a part of the first inorganic layer (S330).

The organic layer may be formed using an inkjet coating, a slit coating process or a screen printing process. In addition, the temperature at which the organic layer is formed may be controlled to be below 110° C.

Subsequently, referring to FIG. 3, a second inorganic layer is formed on the organic layer so that it completely covers the organic layer (S340).

In doing so, apart of the second inorganic layer completely covers the organic layer, and the edges of the second inorganic layer 150 that do not cover the organic layer 140 come in contact with the first inorganic layer 130.

The second inorganic layer has substantially the same composition as the first inorganic layer. Accordingly, the second inorganic layer may be formed by using the same method used for forming the first inorganic layer described above.

Figure 4:
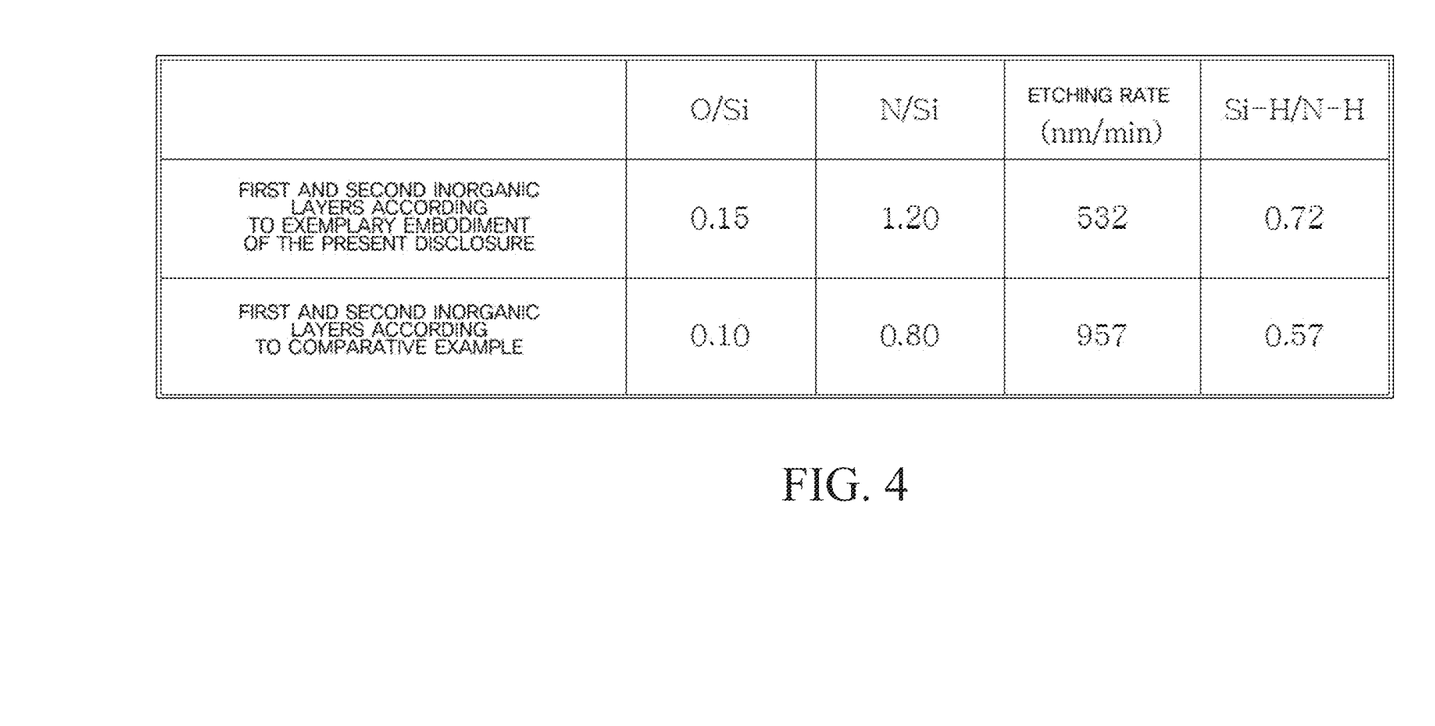
FIG. 4 is a table comparing composition of first and second inorganic layers according to an exemplary embodiment of the present disclosure with composition of first and second inorganic layers according to a Comparative Example.

FIG. 4 is a table for comparing the compositions of the first inorganic layer and the second inorganic layer according to the exemplary embodiment of the present disclosure with the compositions of a first inorganic layer and a second inorganic layer according to a Comparative Example.

The first and second inorganic layers according to the exemplary embodiment of the present disclosure and those according to the Comparative Example all were made substantially of hydrogenated silicon nitride ($SiN_x$:H), and were produced by plasma-enhanced chemical vapor deposition (PECVD) with a silane ($SiH_4$) gas and an ammonia ($NH_3$) gas as source gases at the pressure of $10^{-3}$ Torr.

The ratio of oxygen to silicon and the ratio of nitrogen to silicon shown in FIG. 4 were measured using an XPS. The etch rate was measured for a hydrofluoric solution in which hydrofluoric acid (HF) and water are mixed at the ratio of 1:6. The ratio of silicon-hydrogen bonds to nitrogen-hydrogen bonds (Si—H/N—H) was measured using a Fourier transform infrared spectrometer (FT-IR).

Referring to FIG. 4, the first and second inorganic layers according to the exemplary embodiment of the present disclosure have the ratio of oxygen to silicon of 0.15 and the ratio of nitrogen to silicon of 1.20. In contrast, the first and second inorganic layers according to the Comparative Example have the ratio of oxygen to silicon of 0.10 and the ratio of nitrogen to silicon of 0.80.

In addition, referring to FIG. 4, the first and second inorganic layers according to the exemplary embodiment of the present disclosure have the etch rate of 532 nm/min, while the first and second inorganic layers according to the Comparative Example have the etch rate of 957 nm/min. It can be seen from the comparison results that the first and second inorganic layers according to the exemplary embodiment of the present disclosure have thicker composition than those according to the Comparative Example. Accordingly, it can be seen that the exemplary embodiment can more effectively suppress moisture and oxygen from permeating the organic light-emitting element.

In addition, referring to FIG. 4, the first and second inorganic layers according to the exemplary embodiment of the present disclosure have the ratio of silicon-hydrogen bonds to nitrogen-hydrogen bonds (Si—H/N—H) of 0.72. In contrast, the first and second inorganic layers according to the Comparative Example have the ratio of silicon-hydrogen bonds to nitrogen-hydrogen bonds (Si—H/N—H) of 0.57, which is lower than that of the former.

Figure 5A:
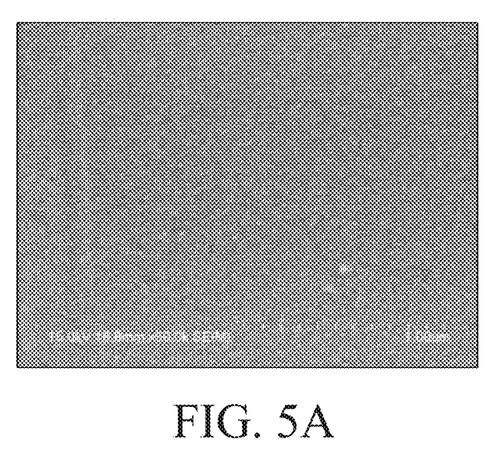
FIG. 5A is a picture of an interface between a first inorganic layer and a second inorganic layer according to an exemplary embodiment of the present disclosure.
Figure 5B:
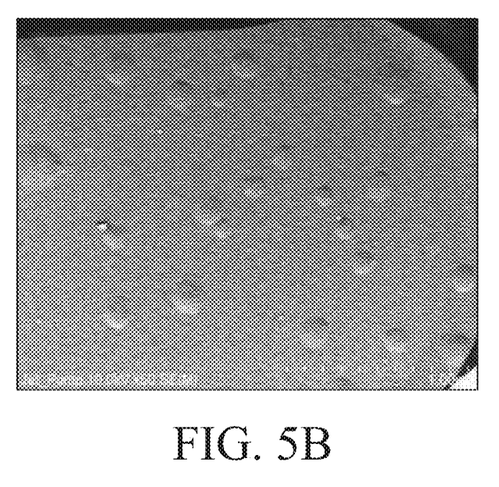
FIG. 5B is a picture of an interface between a first inorganic layer and a second inorganic layer according to a Comparative Example.

FIG. 5A is a microscopic photo of the interface between the first inorganic layer and the second inorganic layer according to the exemplary embodiment of the present disclosure. FIG. 5B is a microscopic photo of the interface between the first inorganic layer and the second inorganic layer according to the Comparative Example.

As shown in FIGS. 5A and 5B, a minimal number of relatively small-sized bubbles exist in the interface between the first and second inorganic layers according to the exemplary embodiment of the present disclosure, while an undesirably high number of relatively large-sized bubbles exist in the interface between the first and second inorganic layers according to the Comparative Example. It can be seen from the comparison results that the first and second inorganic layers according to the exemplary embodiment of the present disclosure are more securely attached to each other than those according to the Comparative Example. Accordingly, the former can more effectively suppress moisture and oxygen from permeating the organic light-emitting element.

Thus far, exemplary embodiments of the present disclosure have been described in detail with reference to the accompanying drawings. However, the present disclosure is not limited to the exemplary embodiments, and modifications and variations can be made thereto without departing from the technical idea of the present disclosure. Accordingly, the exemplary embodiments described herein are merely illustrative and are not intended to limit the scope of the present disclosure. The technical idea of the present disclosure is not limited by the exemplary embodiments. Therefore, it should be understood that the above-described embodiments are not limiting but illustrative in all aspects. The scope of protection sought by the present disclosure is defined by the appended claims and all equivalents thereof are construed to be within the true scope of the present disclosure.

What is claimed is:

1. An organic light-emitting diode (OLED) display, comprising:
   an organic light-emitting element including an anode, an organic light-emitting layer, and a cathode on a substrate;
   a first inorganic layer on the organic light-emitting element made substantially of hydrogenated silicon nitride ($SiN_x$:H);
   an organic layer on a portion of the first inorganic layer; and
   a second inorganic layer on and completely covering the organic layer,
   wherein edges of the second inorganic layer are in contact with the first inorganic layer,
   wherein a ratio of a number of oxygen atoms to silicon atoms contained in the first inorganic layer ranges from 0.12 to 0.19, and a ratio of a number of nitrogen atoms to silicon atoms contained in the first inorganic layer ranges from 0.9 to 1.5, and
   wherein the first inorganic layer and the second inorganic layer have substantially the same composition.

2. The OLED display of claim 1, wherein the first inorganic layer and the second inorganic layer each has a thickness between 5,000 Å and 15,000 Å.

3. The OLED display of claim 2, wherein the first inorganic layer and the second inorganic layer each has a transparency between 90% and 99.9%.

4. The OLED display of claim 3, wherein the OLED display is a top-emission OLED display.

5. The OLED display of claim 1, wherein the first inorganic layer and the second inorganic layer each has an etch rate ranging from 400 nm/min to 700 nm/min in a hydrofluoric solution in which hydrofluoric acid (HF) and water are mixed at the ratio of 1:6.

6. The OLED display of claim 1, wherein a ratio of silicon-hydrogen bonds to nitrogen-hydrogen bonds (Si—H/N—H) contained in each of the first inorganic layer and the second inorganic layer ranges from 0.6 to 0.75.

7. The OLED display of claim 1, wherein each of the first inorganic layer and the second inorganic layer is formed at a temperature between 70° C. and 110° C.

8. The OLED display of claim 1, wherein each of the first inorganic layer and the second inorganic layer is formed by plasma-enhanced chemical vapor deposition (PECVD).

9. The OLED display of claim 1, wherein each of the first inorganic layer and the second inorganic layer is formed at a pressure between $10^{-1}$ Torr and $10^{-5}$ Torr.

10. The OLED display of claim 1, wherein an adhesion length between an edge of the second inorganic layer and an edge of the first inorganic layer is at least 50 μm.

11. The OLED display of claim 1, wherein the organic layer has a thickness between 5 μm and 30 μm.

12. The OLED display of claim 11, wherein the organic layer is made of an acryl-based resin or an epoxy-based resin.

13. The OLED display of claim 1, wherein the substrate is a flexible substrate.

14. A method of manufacturing an organic light-emitting diode (OLED) display, the method comprising:
   forming an organic light-emitting element including an anode, an organic light-emitting layer, and a cathode on a substrate;
   forming a first inorganic layer made substantially of hydrogenated silicon nitride ($SiN_x$:H) on the organic light-emitting element;
   forming an organic layer on a part of the first inorganic layer; and
   forming a second inorganic layer on the organic layer such that it completely covers the organic layer,
   wherein edges of the second inorganic layer come in contact with the first inorganic layer,
   wherein a ratio of a number of oxygen atoms to silicon atoms contained in the first inorganic layer ranges from 0.12 to 0.19, and a ratio of a number of nitrogen atoms to silicon atoms contained in the first inorganic layer ranges from 0.9 to 1.5, and wherein the first inorganic layer and the second inorganic layer have substantially the same composition.

15. The method of claim 14, wherein the forming of the first organic layer and the forming of the second organic layer each comprises:
supplying a silane ($SiH_4$) gas and an ammonia ($NH_3$) gas onto the organic light-emitting element; and
converting the silane ($SiH_4$) gas and the ammonia ($NH_3$) gas into plasma.

16. The method of claim 15, wherein the supplying of the silane ($SiH_4$) gas and the ammonia ($NH_3$) gas comprises supplying a nitrogen ($N_2$) gas.

17. The method of claim 15, wherein each of the ratio of the number of oxygen atoms to silicon atoms contained in the first inorganic layer and the ratio of the number of nitrogen atoms to silicon atoms contained in the first inorganic layer is achieved by adjusting a ratio of the ammonia ($NH_3$) gas to the silane ($SiH_4$) gas supplied onto the organic light-emitting element.

18. The method of claim 14, wherein oxygen ($O_2$) contained in each of the first inorganic layer and the second inorganic layer is derived from ambient air.

19. A flexible display apparatus comprising:
a substrate having a flexible characteristic;
an organic light-emitting element comprising an anode, an organic light-emitting layer, and a cathode on the substrate;
a first inorganic layer that completely covers the organic light-emitting element, the first inorganic layer consists of a silicon nitride material;
an organic layer configured to compensate a crack caused by a foreign matter with respect to the first inorganic layer, wherein the organic layer covers a portion of the first inorganic layer; and
a second inorganic layer that completely covers the organic layer, and covers another portion of the first inorganic layer so that the organic layer is sealed by the first inorganic layer and the second inorganic layer,
wherein the first inorganic layer, the organic layer, and the second inorganic layer have flexible characteristics, and
wherein a first range with respect to a ratio of a number of oxygen atoms to silicon atoms contained in the first inorganic layer and the second inorganic layer, and a second range with respect to a ratio of a number of nitrogen atoms to silicon atoms contained in the first inorganic layer and the second inorganic layer are determined to minimize blistering phenomenon.

20. The flexible display apparatus of claim 19, wherein the first range is from 0.12 to 0.19, and the second range is from 0.9 to 1.5.

* * * * *